(12) United States Patent
Kang et al.

(10) Patent No.: US 7,724,569 B2
(45) Date of Patent: May 25, 2010

(54) 1-TRANSISTOR TYPE DRAM DRIVING METHOD WITH AN IMPROVED WRITE OPERATION MARGIN

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 133 days.

(21) Appl. No.: 12/166,753

(22) Filed: Jul. 2, 2008

(65) Prior Publication Data

US 2009/0168558 A1    Jul. 2, 2009

(30) Foreign Application Priority Data

Jan. 2, 2008    (KR)    ...................... 10-2008-0000289

(51) Int. Cl.
*G11C 11/34*    (2006.01)

(52) U.S. Cl. ................................... 365/185.03; 365/149

(58) Field of Classification Search ............ 365/185.03, 365/185.28, 149
See application file for complete search history.

(56) References Cited

U.S. PATENT DOCUMENTS 6,259,634 B1 *    7/2001    Kengeri et al. ......... 365/189.04

7,075,821 B2 *    7/2006    Ye et al. ...................... 365/174
7,630,262 B2 *    12/2009    Kang et al. .................. 365/207

FOREIGN PATENT DOCUMENTS

| KR | 100714309 B1 | 4/2007 |
|---|---|---|
| KR | 100773349 B1 | 10/2007 |
| KR | 100800156 B1 | 1/2008 |
| KR | 100861190 B1 | 9/2008 |

* cited by examiner

*Primary Examiner*—Anh Phung
(74) *Attorney, Agent, or Firm*—Ladas & Parry LLP

(57) ABSTRACT

A 1-transistor type DRAM driving process writes a data bit that corresponds to a level applied to a bit line. A first hold period holds data by deactivating a word line of an NMOS transistor and precharging a source and bit line. After the first hold period, a complex operation period operates the NMOS transistor and a bipolar transistor by activating the word line of the NMOS transistor, shifting the source line voltage to a ground voltage, and shifting the bit line voltage to a corresponding multi level bit voltage level. After the complex operation period, a bipolar transistor operation period operates only the bipolar transistor by deactivating the word line of the NMOS transistor. After the bipolar transistor operation period, a second hold period holds the data by precharging the source and bit lines of the NMOS transistor and the bit level applied to the bit line is written.

6 Claims, 14 Drawing Sheets

STORE "1" STATE

STORE "0" STATE

1-TRANSISTOR TYPE DRAM DRIVING METHOD WITH AN IMPROVED WRITE OPERATION MARGIN

CROSS-REFERENCE TO RELATED APPLICATIONS

The present application claims priority to Korean patent application number 10-2008-000289 filed on Jan. 2, 2008, which is incorporated herein by reference in its entirety.

BACKGROUND OF THE INVENTION

The present invention relates to a semiconductor apparatus, and more particularly to a 1-transistor type DRAM driving method performing a multi-bit operation.

Generally, a semiconductor device such as DRAM is integrated on a silicon wafer. However, in a silicon wafer used in a semiconductor device, a limited thickness of several μm from the surface of the silicon wafer is used in for device operation rather than the entire silicon wafer. As a result, the remaining silicon wafer not used for the device operation increases power consumption and decreases driving speed.

Therefore, a silicon on insulator (SOI) wafer configured by forming a silicon single crystal layer having a thickness of several μm by interposing an insulating layer between silicon substrates has been called for. A semiconductor device integrated on the SOI wafer has been shown to increase speed due to a small junction capacity thereof and can satisfy high-speed and low-voltage operation due to a low threshold voltage of the SOI wafer, as compared to a semiconductor device integrated on a general silicon wafer.

FIG. 1 is a cross-sectional view showing a DRAM cell implemented on a conventional SOI wafer. In FIG. 1, a SOI wafer 10 is configured of a stacked structure including a silicon substrate 1, a buried oxide layer 2, and a silicon layer 3. A device isolating layer 11, defining an activation region on the silicon layer 3 of the SOI wafer 10, is formed to adjoin the buried oxide layer 2. A gate 12 is formed on a upper surface of the activation region of the silicon layer 3 and source/drain regions 13a, 13b are formed in the silicon layer 3 on both sides of the gate 12 to adjoin the buried oxide layer 2.

In a DRAM cell implemented on the SOI wafer 10, holes and electrons are captured by a floating body corresponding to a channel region below the gate 12 so that data can be stored.

For example, as shown in FIG. 2a, a store state "1" may be illustrated where lots of holes are in the floating body. As shown in FIG. 2b, a store state "0" may be illustrated where less holes or lots of electrons are in the floating body. In a read state, a higher sensing current flows through a 1-transistor type cell in a store state "1" than in a store state "0".

For such a DRAM cell implemented on the conventional SOI wafer as described above, a need exists for a method capable of efficiently writing and reading data in a low voltage state and a method capable of stably driving a multi-bit operation of the 1-transistor type DRAM cell.

SUMMARY OF THE INVENTION

The present invention is to provides a 1-transistor type DRAM driving method capable of improving a write operation margin corresponding to multi-bit by generating a large amount of hole carriers.

There is provided a 1-transistor type DRAM driving method performing a data write of a bit corresponding to a level applied to a bit line, the method including: a first hold period which holds data by non-activating a word line of an NMOS transistor and precharging a source line and a bit line thereof; after the first hold period, a complex operation period which operates NMOS transistor component and bipolar transistor component together by activating the word line of the NMOS transistor, shifting the source line voltage thereof to ground voltage, and shifting the bit line voltage thereof to voltage level of the corresponding bit among multi levels; after the complex operation period, a bipolar transistor operation period which operates only the bipolar transistor component by non-activating the word line of the NMOS transistor; and after the bipolar transistor operation period, a second hold period which holds the data by precharging the source line and the bit line of the NMOS transistor, whereby the data write of the bit corresponding to the level applied to the bit line is performed.

The bit line can be applied with a voltage level having any one of 4-level voltage corresponding to 2-bit during the complex operation period and the bipolar transistor operation, for a data write.

The bit line can also be applied with a write voltage level corresponding to any one of data "00", "01", "10", and "11" during the complex operation period and the bipolar transistor operation.

There is also provided a 1-transistor type DRAM driving method performing a data write of a bit corresponding to a level applied to a bit line, the method including: a first hold period which holds data by non-activating a word line of an NMOS transistor and precharging a source line and a bit line thereof; after the first hold period, a complex operation period which operates NMOS transistor component and bipolar transistor component together by activating the word line of the NMOS transistor, shifting the source line voltage thereof to ground voltage, and shifting the bit line voltage thereof to voltage level of the corresponding bit among multi levels; after the complex operation period, a bipolar transistor operation period which operates only the bipolar transistor component by shifting the word line voltage of the NMOS transistor to negative voltage; and after the bipolar transistor operation period, a second hold period which holds the data by precharging the source line and the bit line of the NMOS transistor, whereby the data write of the bit corresponding to the level applied to the bit line is performed.

The bit line can be applied with a voltage level having any one of 4-level voltage corresponding to 2-bit during the complex operation period and the bipolar transistor operation, for a data write.

The bit line can also be applied with a write voltage level corresponding to any one of data "00", "01", "10", and "11" during the complex operation period and the bipolar transistor operation.

DESCRIPTION OF SPECIFIC EMBODIMENTS

A 1-transistor floating body type DRAM according to the present invention is configured of a NMOS transistor component and a parasitic NPN bipolar transistor component. In the parasitic NPN bipolar transistor component, a floating body forms a base, a source line L forms an emitter, and a bit line BL forms a collector.

The 1-transistor floating body type DRAM according to the present invention can improve reliability of a cell and increase read speed of the data since data of the cell is not destroyed when reading the data in a non destructive read out (NDRO) manner. Also, the 1-transistor floating body type DRAM according to the present invention can improve a write operation margin of the data since a large amount of hole carriers can be captured by the floating body.

Figure 1:
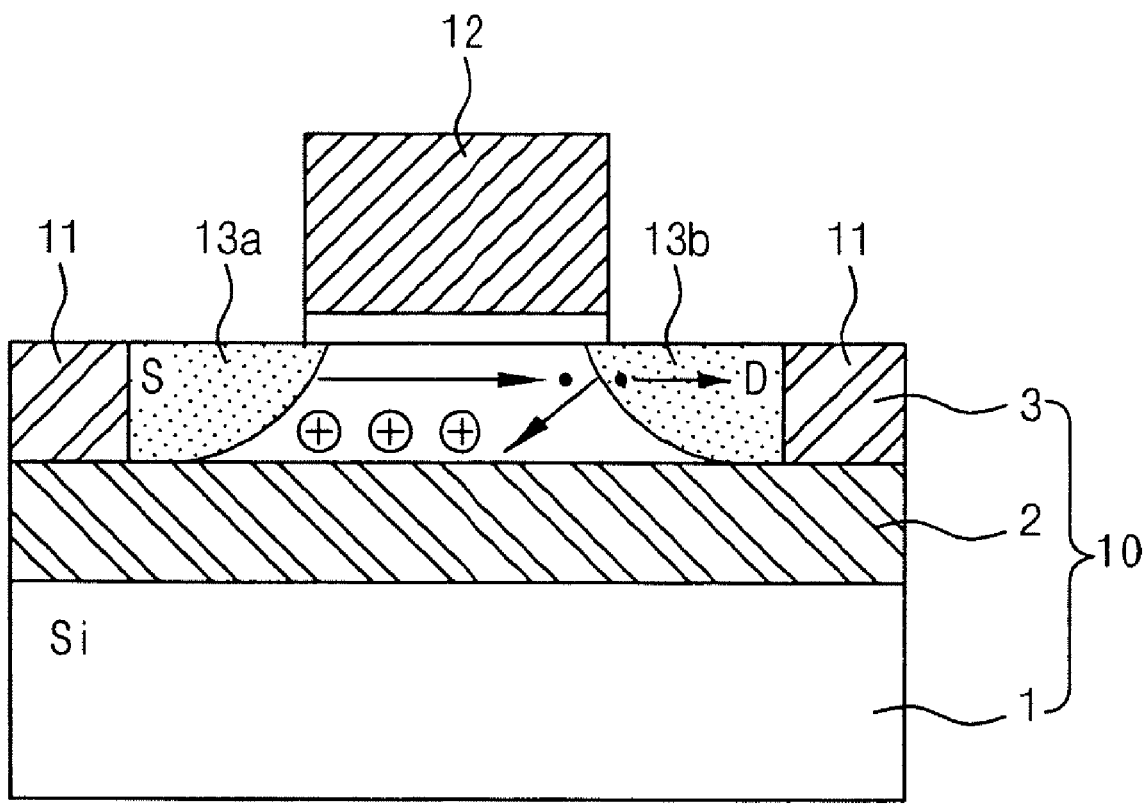
FIG. 1 is a cross-sectional view showing a floating body cell of a conventional SOI structure.
Figure 2A:
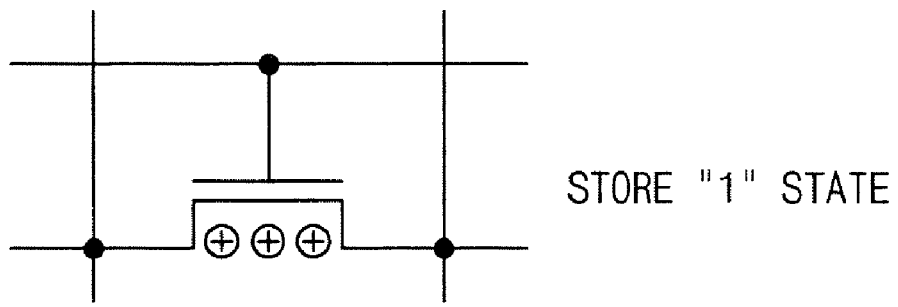
FIGS. 2a and 2b are circuit views explaining a data store state of a conventional 1-transistor type floating body cell.
Figure 2B:
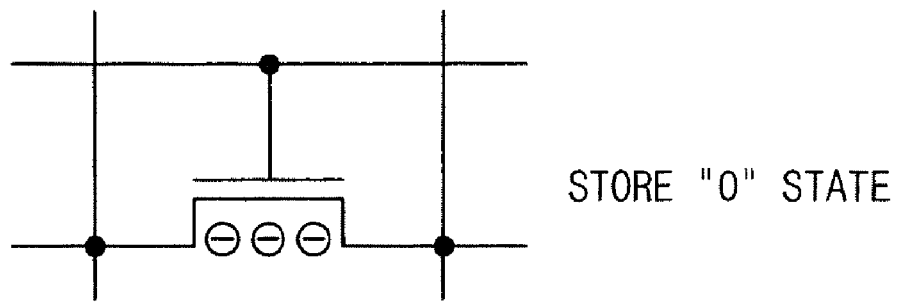
Figure 3A:
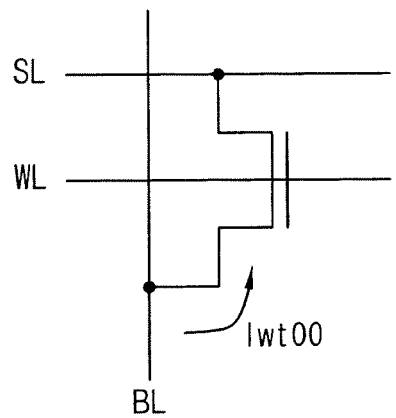
FIGS. 3a and 3b are a circuit view and a waveform view explaining a data "00" write according to a first embodiment of the 1-transistor type DRAM driving method of the present invention.
Figure 3B:
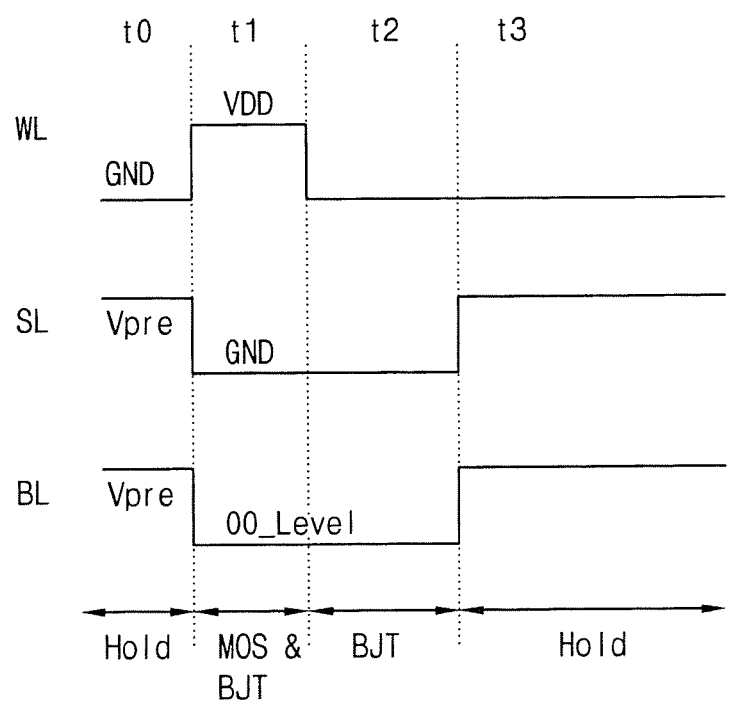
Figure 4A:
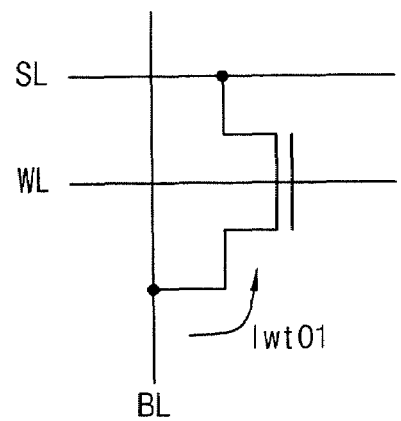
FIGS. 4a and 4b are a circuit view and a waveform view explaining a data "01" write according to the first embodiment of the 1-transistor type DRAM driving method of the present invention.
Figure 4B:
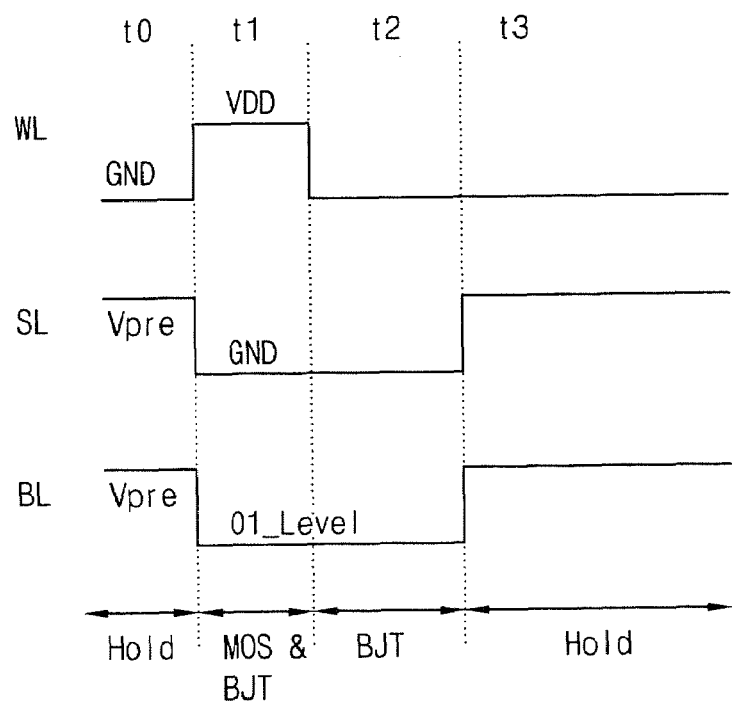
Figure 5A:
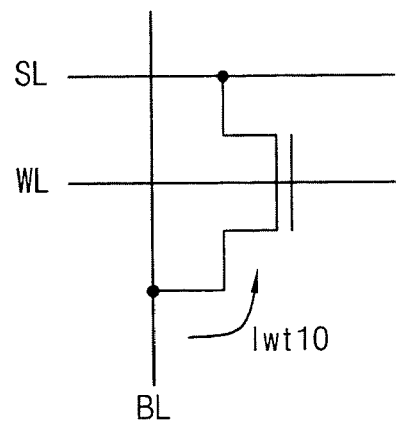
FIGS. 5a and 5b are a circuit view and a waveform view explaining a data "10" write according to the first embodiment of the 1-transistor type DRAM driving method of the present invention.
Figure 5B:
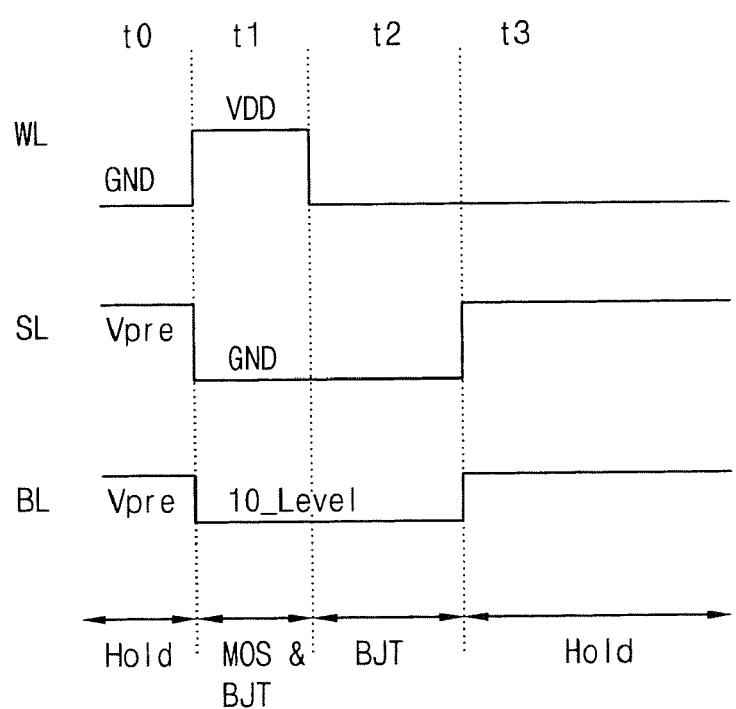
Figure 6A:
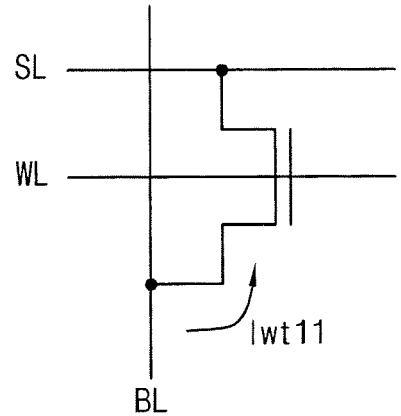
FIGS. 6a and 6b are a circuit view and a waveform view explaining a data "11" write according to the first embodiment of the 1-transistor type DRAM driving method of the present invention.
Figure 6B:
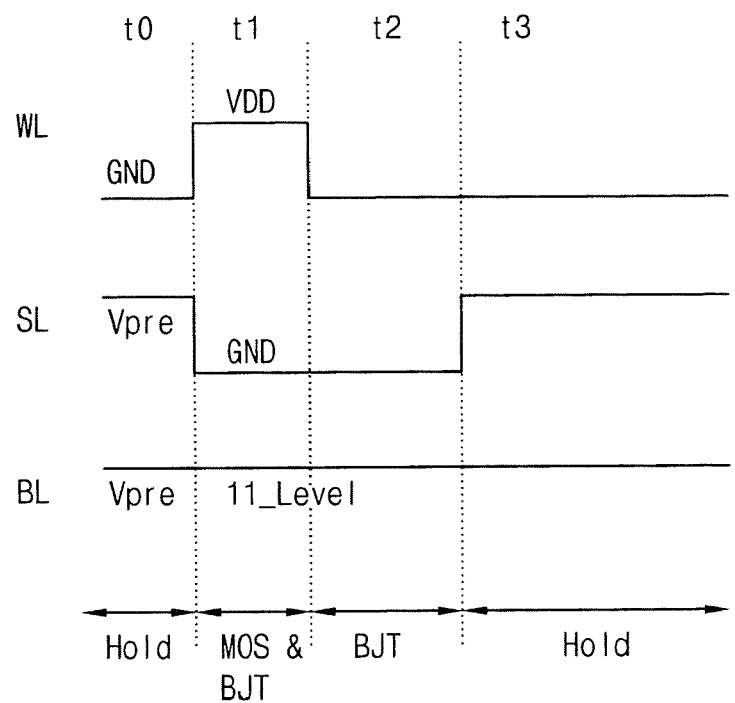

A first embodiment of a write method of the present invention will be described with reference to FIGS. 3 to 6. FIGS. 3a and 3b are views regarding a data "00" write operation, FIGS. 4a and 4b are views regarding a data "01" write operation, FIGS. 5a and 5b are views regarding a data "10" write operation, and FIGS. 6a and 6b are views regarding a data "11" write operation.

A data "00" write method according to the first embodiment will be described with reference to FIGS. 3a and 3b. FIGS. 3a and 3b represent a method for writing a 4-level 2-bit cell data "00".

Periods t0 and t3 are hold periods and become a data sustain period.

A t1 period is a complex operation period MOS & BJT wherein a word line WL voltage is turned on to VDD to perform an NMOS transistor operation when writing data in the cell.

Also in the t1 period, a source line SL voltage is shifted from a precharge voltage Vpre to a ground voltage GND so that a forward voltage is biased between a P-type semiconductor of the floating body of the NMOS transistor and an N-type semiconductor of the source line SL thereof and thereby, the parasitic bipolar transistor BJT operates.

However, the bit line BL voltage and the source line SL voltage are shifted to a "00" level together so that a data "00" write current Iwt00 enters a turn-off state.

A t2 period is a bipolar transistor operation period BJT, wherein the word line WL voltage is shifted back to the ground voltage GND so that only the parasitic bipolar transistor BJT operates.

In the data "00" write state, the bit line BL voltage and the source line SL voltage are shifted to the ground voltage GND together so that the data "00" write current Iwt00 becomes "0" and is turned-off.

Therefore, a large amount of hole charge remaining in the floating body is discharged into the bit line BL and the source line SL.

FIGS. 4a and 4b represent a method for writing a 4-level 2-bit cell data "01" according to the first embodiment of the present invention.

Periods t0 and t3 are hold periods and become a data sustain period.

A t1 period is a complex operation period MOS & BJT wherein the word line WL voltage is turned on to VDD to perform an NMOS transistor operation when writing data in the cell.

Also in the t1 period, the source line SL voltage is shifted from the precharge voltage Vpre to the ground voltage GND so that the forward voltage is biased between a P-type semiconductor of the floating body of the NMOS transistor and an N-type semiconductor of the source line SL thereof and thereby, the parasitic bipolar transistor operates.

However, the bit line BL voltage is shifted to a "01" level so that a data "01" write current Iwt01 flows.

A t2 period is a bipolar transistor operation period BJT, wherein the word line WL voltage is shifted back to the ground voltage GND so that only the parasitic bipolar transistor BJT operates.

In the data "01" write state, the bit line BL voltage becomes a "01" level and the source line SL voltage is shifted to the ground voltage GND so that the data "01" write current Iwt01 flows.

Therefore, the hole charge in proportion to the data "01" write current Iwt01 is accumulated in the floating body.

FIGS. 5a and 5b represent a method for writing a 4-level 2-bit cell data "10" according to the first embodiment of the present invention.

Periods t0 and t3 are hold periods and become a data sustain period.

A t1 period is a complex operation period MOS & BJT wherein the word line WL voltage is turned on to VDD to perform an NMOS transistor operation when writing data in the cell.

Also in the t1 period, the source line SL voltage is shifted from the precharge voltage Vpre to the ground voltage GND so that the forward voltage is biased between a P-type semiconductor of the floating body of the NMOS transistor and an N-type semiconductor of the source line SL thereof and thereby, the parasitic bipolar transistor operates.

However, the bit line BL voltage is shifted to a "10" level so that a data "10" write current Iwt10 flows.

A t2 period is a bipolar transistor operation period BJT, wherein the word line WL voltage is shifted back to the ground voltage GND so that only the parasitic bipolar transistor BJT operates.

In the data "10" write state, the bit line BL voltage becomes a "10" level and the source line SL voltage is shifted to the ground voltage GND so that the data "10" write current Iwt10 flows.

Therefore, the hole charge in proportion to the data "10" write current Iwt10 is accumulated in the floating body.

FIGS. 6a and 6b represent a method for writing a 4-level 2-bit cell data "11" according to the first embodiment of the present invention.

Periods t0 and t3 are hold period and become a data sustain period.

A t1 period is a complex operation period MOS & BJT wherein the word line WL voltage is turned on to VDD to perform an NMOS transistor operation when writing data in the cell.

Also in the t1 period, the source line SL voltage is shifted from the precharge voltage Vpre to the ground voltage GND so that the forward voltage is biased between a P-type semiconductor of the floating body of the NMOS transistor and an N-type semiconductor of the source line SL thereof and thereby, the parasitic bipolar transistor operates.

However, the bit line BL voltage is shifted to a "11" level so that a data "11" write current Iwt11 flows.

A t2 period is a bipolar transistor operation period BJT, wherein the word line WL voltage is shifted back to the ground voltage GND so that only the parasitic bipolar transistor BJT operates.

In the data "11" write state, the bit line BL voltage becomes a "11" level and the source line SL voltage is shifted to the ground voltage GND so that the data "11" write current Iwt11 flows.

Therefore, the hole charge in proportion to the data "11" write current Iwt11 is accumulated in the floating body.

Figure 7A:
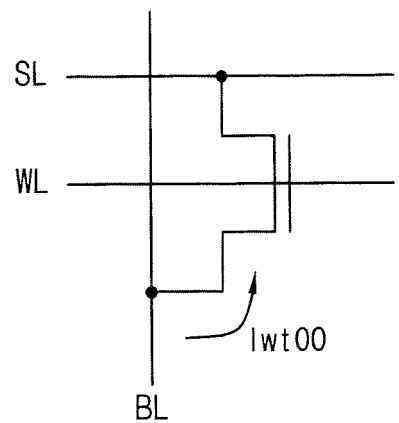
FIGS. 7a and 7b are a circuit view and a waveform view explaining a data "00" write according to a second embodiment of the 1-transistor type DRAM driving method of the present invention.
Figure 7B:
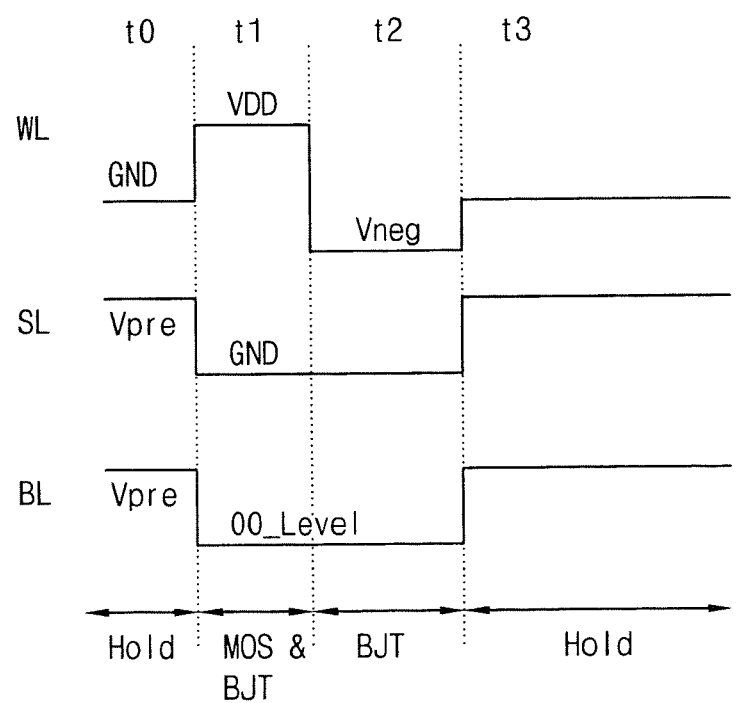
Figure 8A:
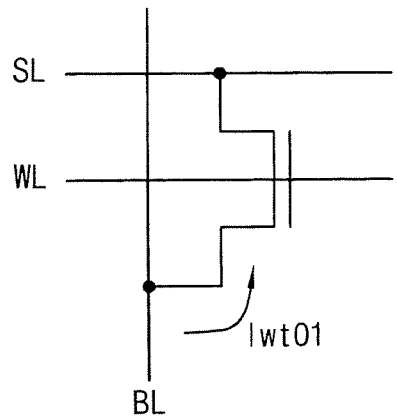
FIGS. 8a and 8b are a circuit view and a waveform view explaining a data "01" write according to the second embodiment of the 1-transistor type DRAM driving method of the present invention.
Figure 8B:
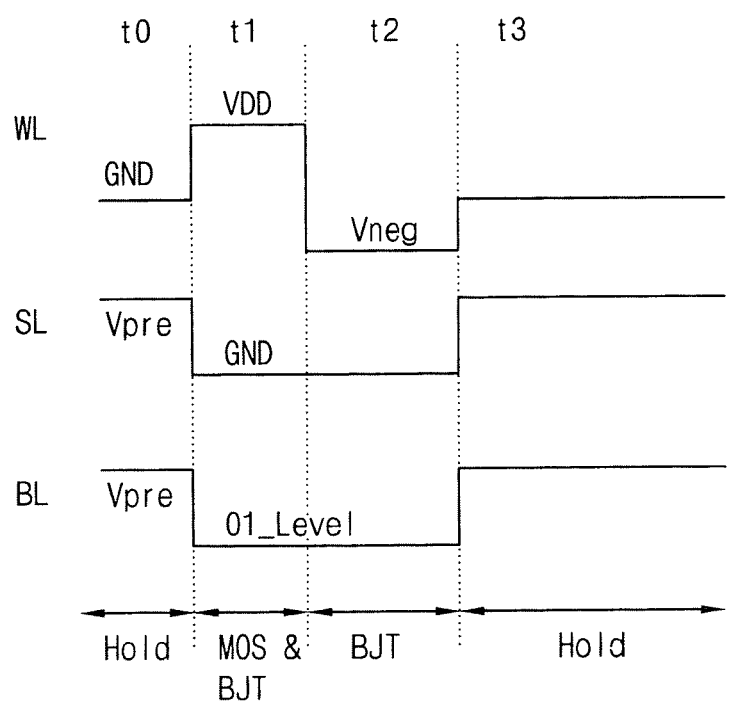
Figure 9A:
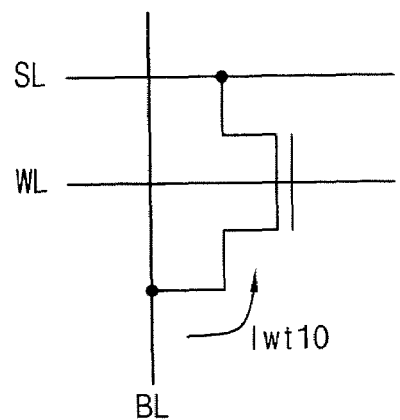
FIGS. 9a and 9b are a circuit view and a waveform view explaining a data "10" write according to the second embodiment of the 1-transistor type DRAM driving method of the present invention.
Figure 9B:
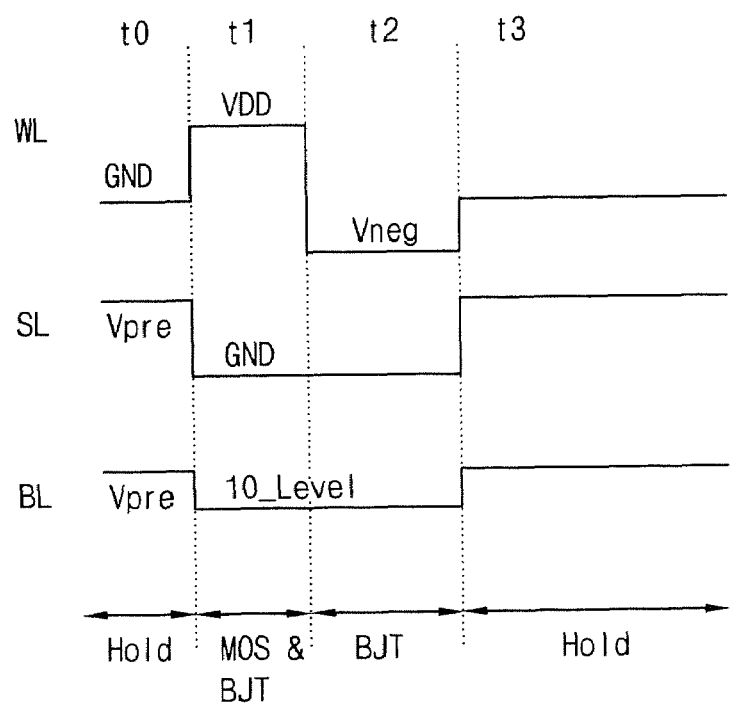
Figure 10A:
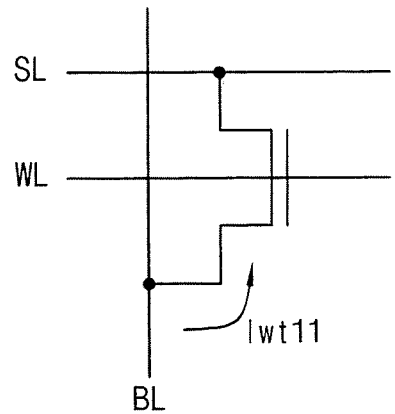
FIGS. 10a and 10b are a circuit view and a waveform view explaining a data "11" write according to the second embodiment of the 1-transistor type DRAM driving method of the present invention.
Figure 10B:
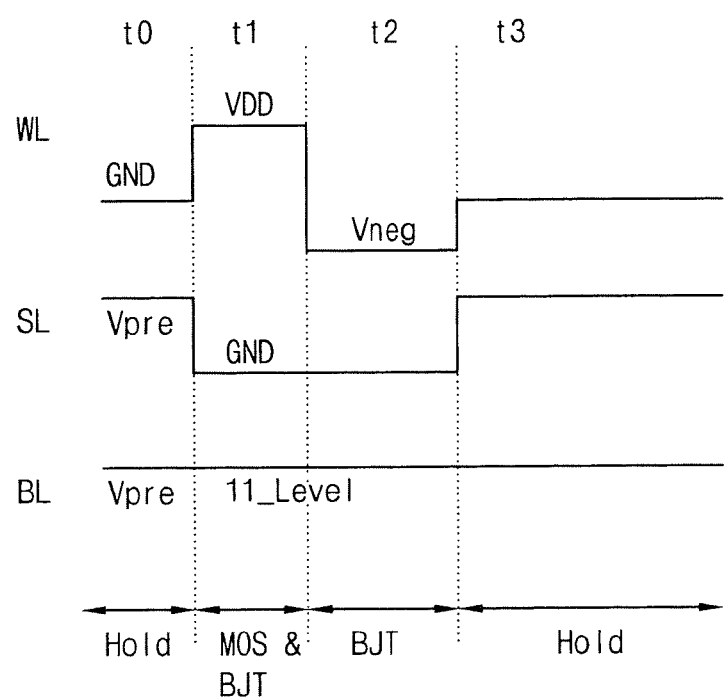

A second embodiment of a write method of the present invention will now be described with reference to FIGS. 7 to 10. FIGS. 7a and 7b are views regarding a data "00" write operation, FIGS. 8a and 8b are views regarding a data "01" write operation, FIGS. 9a and 9b are views regarding a data "10" write operation, and FIGS. 10a and 10b are views regarding a data "11" write operation.

A data "00" write method according to the second embodiment will be described with reference to FIGS. 7a and 7b. FIGS. 7a and 7b represent a method for writing a 4-level 2-bit cell data "00".

Periods t0 and t3 are hold periods and become a data sustain period.

A t1 period is a complex operation period MOS & BJT wherein the word line WL voltage is turned on to VDD to perform an NMOS transistor operation when writing data in the cell.

Also in the t1 period, the source line SL voltage is shifted from the precharge voltage Vpre to the ground voltage GND so that the forward voltage is biased between a P-type semiconductor of the floating body of the NMOS transistor and an N-type semiconductor of the source line SL thereof and thereby, the parasitic bipolar transistor BJT operates.

However, the bit line BL voltage is shifted to a "00" level so that a data "00" write current Iwt00 flows.

A t2 period is a bipolar transistor operation period BJT, wherein the word line WL voltage is shifted to a negative voltage Vneg so that only the parasitic bipolar transistor BJT operates.

As the word line WL voltage is shifted to the negative voltage Vneg, more hole carriers can be captured by the floating body making it possible to improve a data "01" write operation margin.

In the data "00" write state, the bit line BL voltage and the source line SL voltage are shifted to the ground voltage GND so that the data "00" write current Iwt00 becomes "0".

Therefore, a large amount of hole charge remaining in the floating body is discharged into the bit line BL and the source line SL.

FIGS. 8a and 8b represent a method for writing a 4-level 2-bit cell data "01" according to the second embodiment of the present invention.

Periods t0 and t3 are hold periods and become a data sustain period.

A t1 period is a complex operation period MOS & BJT, wherein the word line WL voltage is turned on to VDD to perform an NMOS transistor operation when writing data in the cell.

Also in the t1 period, the source line SL voltage is shifted to the ground voltage GND from the precharge voltage Vpre so that the forward voltage is biased between a P-type semiconductor of the floating body of the NMOS transistor and an N-type semiconductor of the source line SL thereof and thereby, the parasitic bipolar transistor BJT operates.

However, the bit line BL voltage is shifted to a "01" level so that a data "01" write current Iwt01 flows.

A t2 period is a bipolar transistor operation period BJT, wherein the word line WL voltage is shifted to the negative voltage Vneg so that only the parasitic bipolar transistor BJT operates.

As the word line WL voltage is shifted to the negative voltage Vneg, more hole carriers can be captured by the floating body making it possible to improve a data "01" write operation margin.

In the data "01" write state, the bit line BL voltage becomes a "01" level and the source line SL voltage is shifted to the ground voltage GND so that a data "01" write current Iwt01 flows.

Therefore, a hole charge in proportion to the data "01" write current Iwt01 is accumulated in the floating body.

FIGS. 9a and 9b represent a method for writing a 4-level 2-bit cell data "10" according to the second embodiment of the present invention.

Periods t0 and t3 are hold periods and become a data sustain period.

A t1 period is a complex operation period MOS & BJT, wherein the word line WL voltage is turned on to VDD to perform an NMOS transistor operation when writing data in the cell.

Also in the t1 period, the source line SL voltage is shifted from the precharge voltage Vpre to the ground voltage GND so that the forward voltage is biased between a P-type semiconductor of the floating body of the NMOS transistor and an N-type semiconductor of the source line SL thereof and thereby, the parasitic bipolar transistor BJT operates.

However, the bit line BL voltage is shifted to a "10" level so that a data "10" write current Iwt10 flows.

A t2 period is a bipolar transistor operation period BJT, wherein the word line WL voltage is shifted to the negative voltage Vneg so that only the parasitic bipolar transistor BJT operates.

As the word line WL voltage is shifted to the negative voltage Vneg, more hole carriers can be captured by the floating body making it possible to improve a data "10" write operation margin.

In the data "10" write state, the bit line BL voltage becomes a "10" level and the source line SL voltage is shifted to the ground voltage GND so that a data "10" write current Iwt10 flows.

Therefore, a hole charge in proportion to the data "10" write current Iwt10 is accumulated in the floating body.

FIGS. 10a and 10b represent a method for writing a 4-level 2-bit cell data "11" according to the second embodiment of the present invention.

Periods t0 and t3 are hold periods and become a data sustain period.

A t1 period is a complex operation period MOS & BJT, wherein the word line WL voltage is turned on to VDD to perform an NMOS transistor operation when writing data in the cell.

Also in the t1 period, the source line SL voltage is shifted from the precharge voltage Vpre to the ground voltage GND so that the forward voltage is biased between a P-type semiconductor of the floating body of the NMOS transistor and an N-type semiconductor of the source line SL thereof and thereby, the parasitic bipolar transistor BJT operates.

However, the bit line BL voltage is shifted to a "11" level so that a data "11" write current Iwt11 flows.

A t2 period is a bipolar transistor operation period BJT, wherein the word line WL voltage is shifted to the negative voltage Vneg so that only the parasitic bipolar transistor BJT operates.

As the word line WL voltage is shifted to the negative voltage Vneg, more hole carriers can be captured by the floating body making it possible to improve a data "11" write operation margin.

In the data "11" write state, the bit line BL voltage becomes a "11" level and the source line SL voltage is shifted to the ground voltage GND so that a data "11" write current Iwt11 flows.

Therefore, a hole charge in proportion to the data "11" write current Iwt11 is accumulated in the floating body.

Figure 11A:
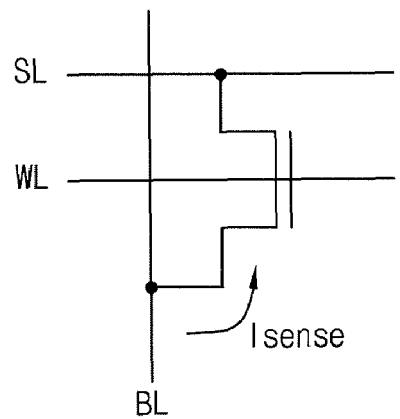
FIGS. 11a and 11b are a circuit view and a waveform view explaining a read method of the 1-transistor type DRAM driving method of the present invention.
Figure 11B:
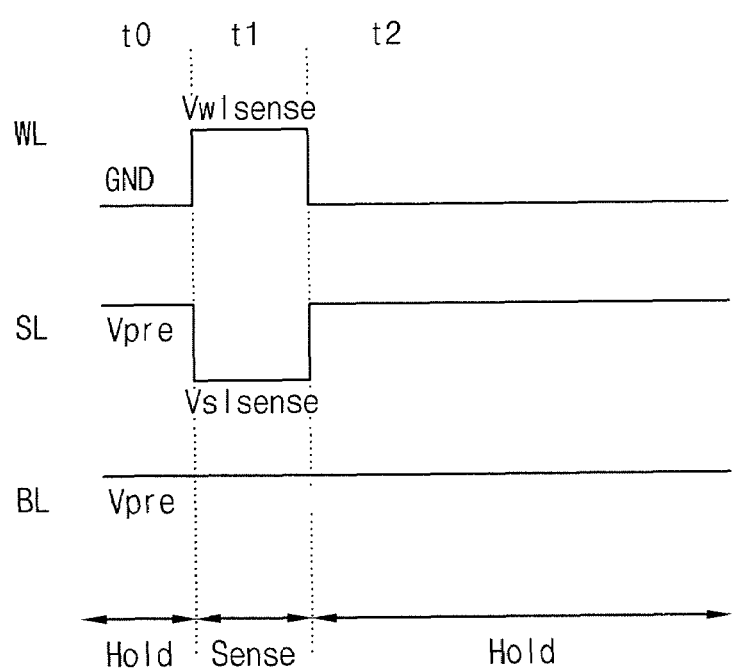

Meanwhile, a read method of a DRAM according to an embodiment of the present invention is explained with reference to FIGS. 11a and 11b.

Periods t0 and t2 are hold periods and are a data sustain period.

A t1 period is a sense period, wherein the word line WL voltage rises to a sensing word line voltage Vwlsense from the ground voltage GND. The sensing word line voltage Vwlsense is a voltage for sensing a sense current Isense flowing from the bit line BL to the source line SL. The source line SL is applied with a sensing source line voltage Vslsense that is lower than the precharge voltage Vpre. At this time, a voltage of less than 0.2V is set between the bit line BL and the source line SL. The bit line BL is set fixed to the precharge voltage Vpre.

Figure 12:
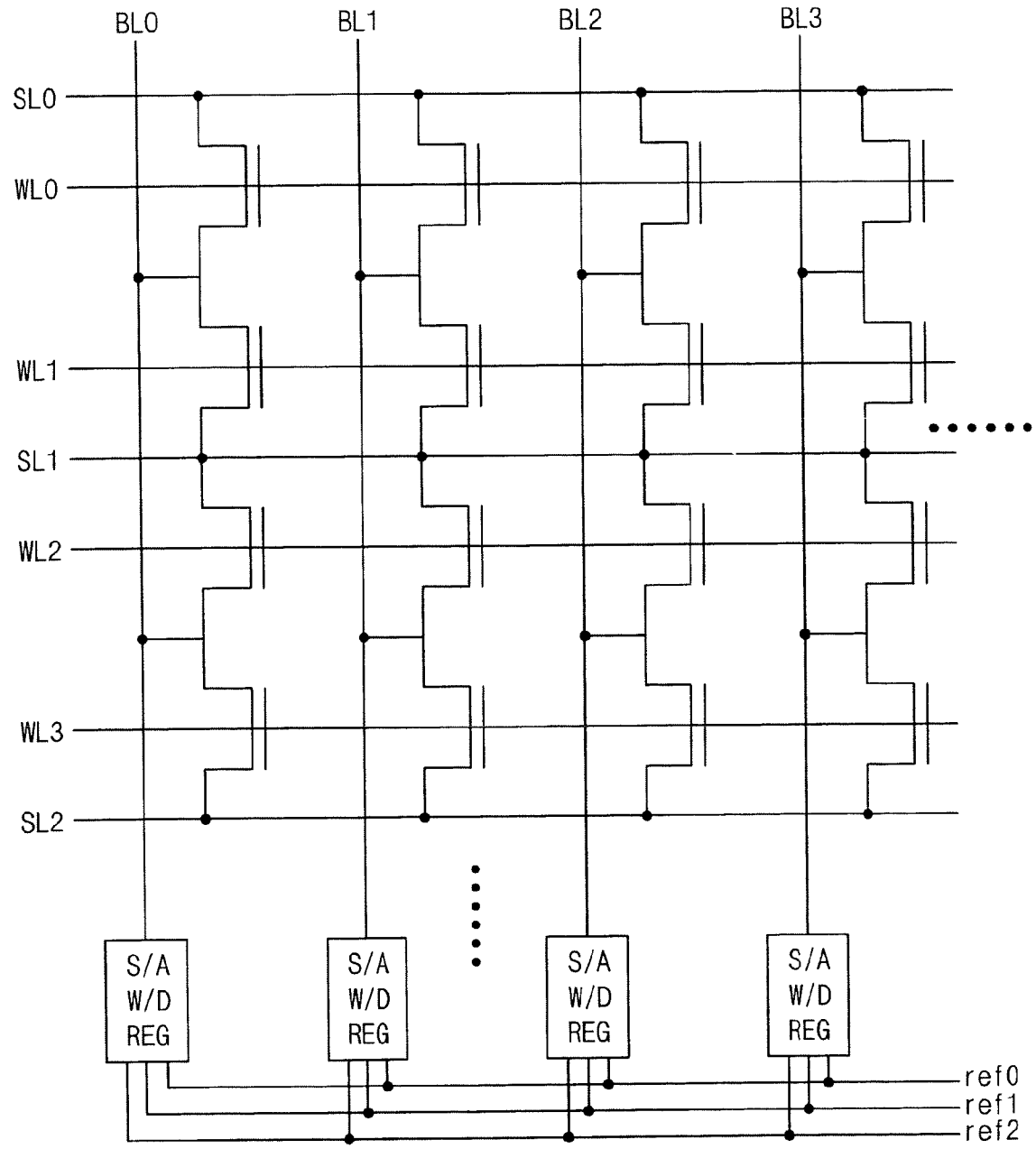
FIG. 12 is a circuit view showing a cell array structure to which an embodiment of the present invention is applied.

The DRAM according to an embodiment of the present invention that performs the write/read operations as described above, has a cell array structure as shown in FIG. 12.

Every two unit cells in a column direction of the cell array share each bit line BL0, BL1, BL2, BL3. Cells in a row direction of the cell array share each source line SL0, SL1, SL2 to a source of the cells and each word line WL0, WL1, WL2 to a gate of the cells.

Each bit line BL is connected to a sense amp S/A, a write driver W/D, and a register block REG, wherein each sense amp S/A, write driver W/D, and register block REG is supplied with a reference voltage ref2, ref1, ref0.

Herein, the sense amp S/A, the write driver W/D, and the register block REG include a sense amp S/A, a write driver W/D, and a register block REG. The sense amp S/A senses cell data to distinguish between Data 11, Data 10, Data 01, and Data 00. The register REG is a temporary memory apparatus circuit for temporarily storing data from the sense amp S/A and the write driver W/D is a circuit for generating a driving voltage Write 11, Write 10, Write 01, and Write 00 to the bit line BL in accordance with write data when writing data in the cell.

Figure 13:
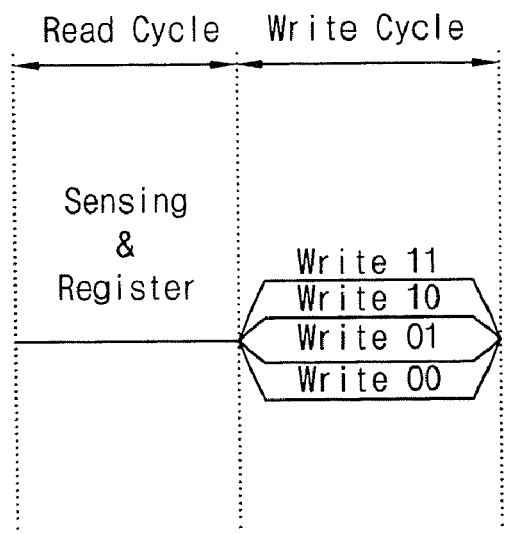
FIG. 13 is a cycle waveform view showing a write method according to an embodiment of the present invention.

A write operation according to an embodiment of the present invention is described with reference to FIG. 13. The write operation includes a read cycle and a write cycle.

Cell data for all the cells in a row direction selected in the read cycle period is sensed and amplified in order to be stored in the register.

In the write cycle period, the data stored in the register in the read cycle is written again and restored. If new data is written, the new data is stored in the register and newly stored external data is written to the cell.

Figure 14:
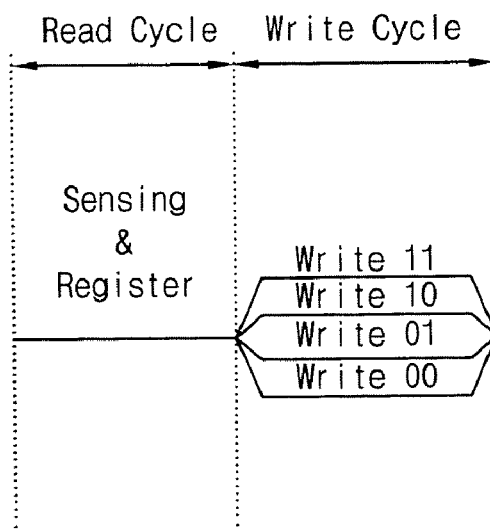
FIG. 14 is a cycle waveform view showing a refresh method according to an embodiment of the present invention.

A refresh operation according to an embodiment of the present invention is described with reference to FIG. 14. The refresh operation includes a read cycle and a write cycle.

Cell data for all the cells in a row direction selected in the read cycle period is sensed and amplified in order to be stored in the register.

In the write cycle period, the data stored in the register in the read cycle is written again and restored.

Figure 15:
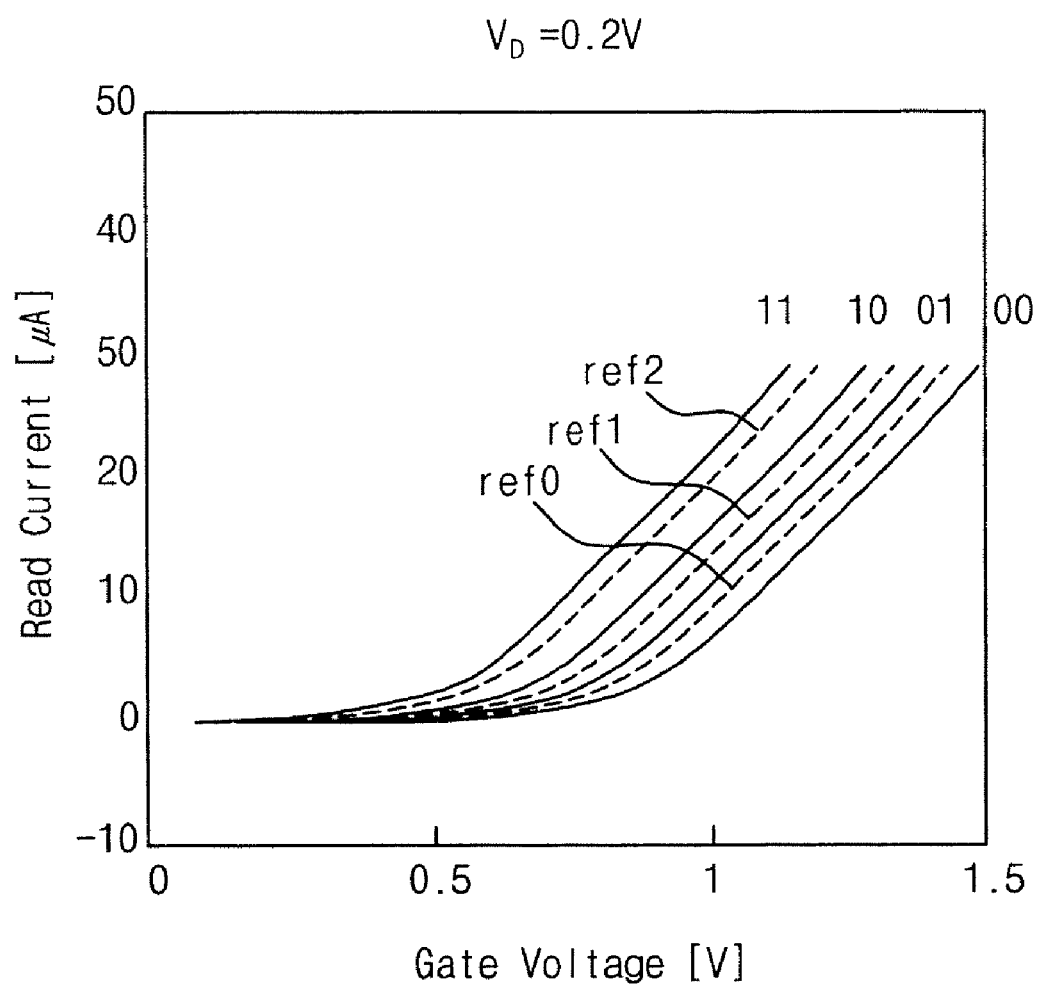
FIG. 15 is a graph showing cell read current according to the 1-transistor type DRAM driving method of the present invention.

The 4-level 2-bit cell read current according to an embodiment of the present invention as operated above can be represented as shown in FIG. 15.

FIG. 15 is a graph showing a cell read current of the DRAM cell when a cell drain voltage Vd is 0.2V, a cell source voltage is ground GND, and a cell gate voltage is swept. As shown in the graph, the highest level is data "11", the next lower level is data "10", the next lower level is data "01", and the lowest level is data "00". The reference voltages REF2, REF1, and REF0 are positioned between each level making it possible to perform a multi-bit read operation.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A 1-transistor type DRAM driving method performing a data write of a bit corresponding to a level applied to a bit line, the method including:

holding data in a first hold period by deactivating a word line of an NMOS transistor component and precharging a source line and a bit line thereof;

operating both the NMOS transistor component and a bipolar transistor component in a complex operation period by activating the word line of the NMOS transistor component, shifting a source line voltage from the precharge to a ground voltage, and shifting a bit line voltage from the precharge to a corresponding multi level bit voltage level after the first hold period;

operating only the bipolar transistor component in a bipolar transistor operation period by deactivating the word line of the NMOS transistor component after the complex operation period; and holding the data in a second hold period by precharging the source line and the bit line of the NMOS transistor component, whereby the data write of the corresponding multi level bit applied to the bit line is performed after the bipolar transistor operation period.

2. The 1-transistor type DRAM driving method as set forth in claim 1, wherein for a data write, the bit line is applied a voltage level having any one of 4 voltage levels each having a corresponding 2-bit level during the complex operation period and the bipolar transistor operation.

3. The 1-transistor type DRAM driving method as set forth in claim 1, wherein the bit line is applied a write voltage level corresponding to any one of data "00", "01", "10", and "11" during the complex operation period and the bipolar transistor operation.

4. A 1-transistor type DRAM driving method performing a data write of a bit corresponding to a level applied to a bit line, the method including:

holding data in a first hold period by deactivating a word line of an NMOS transistor component and precharging a source line and a bit line thereof;

operating both the NMOS transistor component and a bipolar transistor component in a complex operation period by activating the word line of the NMOS transistor component, shifting a source line voltage from the precharge to a ground voltage, and shifting a bit line voltage from the precharge to a corresponding multi level bit voltage level after the first hold period;

operating only the bipolar transistor component in a bipolar transistor operation period by shifting the word line voltage of the NMOS transistor component to a negative voltage after the complex operation period; and holding the data in a second hold period by precharging the source line and the bit line of the NMOS transistor component, whereby the data write of the corresponding multi level bit applied to the bit line is performed after the bipolar transistor operation period.

5. The 1-transistor type DRAM driving method as set forth in claim 4, wherein for a data write, the bit line is applied a voltage level having any one of 4 voltage level voltages each having a corresponding 2-bit level during the complex operation period and the bipolar transistor operation.

6. The 1-transistor type DRAM driving method as set forth in claim 4, wherein the bit line is applied a write voltage level corresponding to any one of data "00", "01", "10", and "11" during the complex operation period and the bipolar transistor operation.

* * * * *